(12) United States Patent
Mengel

(10) Patent No.: US 7,289,223 B2
(45) Date of Patent: Oct. 30, 2007

(54) METHOD AND APPARATUS FOR SPATIALLY RESOLVED POLARIMETRY

(75) Inventor: Markus Mengel, Heidenheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 541 days.

(21) Appl. No.: 10/765,904

(22) Filed: Jan. 29, 2004

(65) Prior Publication Data

US 2004/0262500 A1 Dec. 30, 2004

Related U.S. Application Data

(63) Continuation-in-part of application No. 10/628,431, filed on Jul. 29, 2003.

(30) Foreign Application Priority Data

Jan. 31, 2003 (DE) ................. 103 04 822

(51) Int. Cl.
*G01B 9/02* (2006.01)
(52) U.S. Cl. ..................................... 356/495
(58) Field of Classification Search ................ 356/489, 356/495, 512–515, 364–369
See application file for complete search history.

(56) References Cited

U.S. PATENT DOCUMENTS

| | | | |
|---|---|---|---|
| 5,166,752 A | 11/1992 | Spanier et al. | |
| 5,227,623 A | 7/1993 | Heffner | |
| 5,298,972 A | 3/1994 | Heffner | |
| 5,396,329 A | 3/1995 | Abramovitz | |
| 5,521,705 A * | 5/1996 | Oldenbourg et al. | ........ 356/368 |
| 5,652,673 A | 7/1997 | Oakberg | |
| 5,744,721 A | 4/1998 | Varnum | |
| 5,841,538 A * | 11/1998 | Schoeffler et al. | .......... 356/369 |
| 5,886,810 A | 3/1999 | Siahpoushan et al. | |
| 5,965,874 A | 10/1999 | Aso et al. | |

(Continued)

FOREIGN PATENT DOCUMENTS

DE 101 09 929 A1 11/2001

(Continued)

OTHER PUBLICATIONS

H. P. Povel et al, "Two-dimensional polarimeter with a charge-coupled-device image sensor and a piezoelastic modulator," Applied Optics, Jul. 1, 1994, pp. 4254-4259, vol. 33, No. 19.

(Continued)

*Primary Examiner*—Samuel A. Turner
(74) *Attorney, Agent, or Firm*—Sughrue Mion, PLLC

(57) ABSTRACT

A method and an apparatus for the spatially resolved polarimetric examination of an imaging beam pencil (1) generated by an associated pulsed radiation source (9). A first and a second photoelastic modulator (6a, 6b) and a polarization element (5) are introduced serially into the beam path of the beam pencil. A control unit (8) activates a first modulation oscillation of the first photoelastic modulator and a second modulation oscillation of the second photoelastic modulator and drives the radiation source for outputting a respective radiation pulse in a manner dependent on the oscillation state of the first photoelastic modulator and/or the second photoelastic modulator. A detector (4) detects the beam pencil coming from the polarization element in a spatially resolved manner.

15 Claims, 1 Drawing Sheet

U.S. PATENT DOCUMENTS

Figure 1:
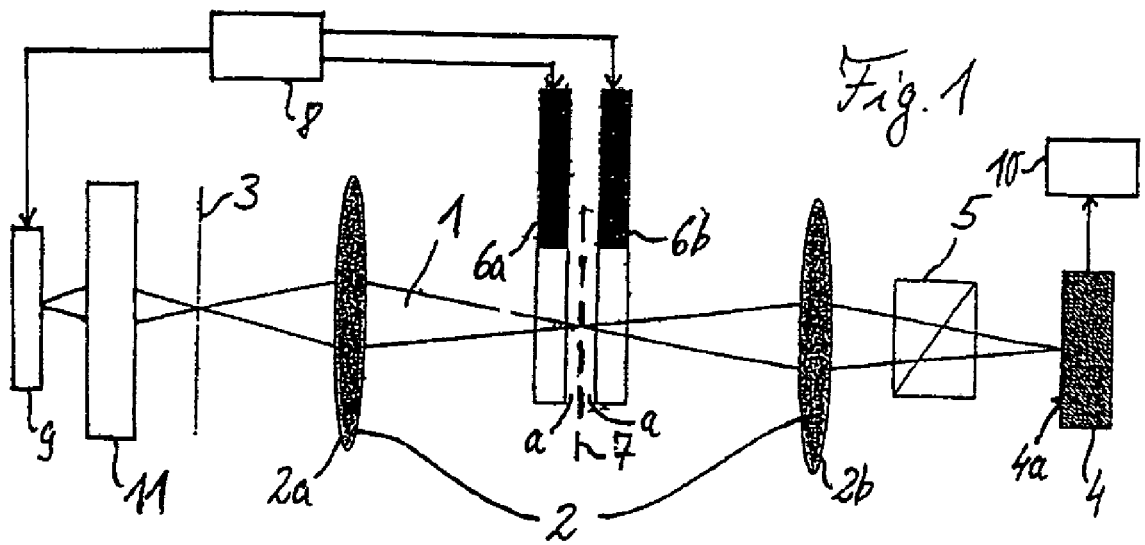

| | | | |
|---|---|---|---|
| 6,204,924 | B1 | 3/2001 | Cyr |
| 6,268,914 | B1 | 7/2001 | Wang |
| 6,312,373 | B1 | 11/2001 | Ichihara |
| 6,344,898 | B1 | 2/2002 | Gemma et al. |
| 6,473,176 | B2 | 10/2002 | Wang et al. |
| 6,473,181 | B1 | 10/2002 | Oakberg |
| 2002/0024673 | A1 | 2/2002 | Ouchi |

FOREIGN PATENT DOCUMENTS

| | | |
|---|---|---|
| EP | 0 396 409 A2 | 11/1990 |
| EP | 0 439 127 A2 | 7/1991 |
| JP | 11-142291 A | 5/1999 |
| WO | WO 02/42728 A1 | 5/2002 |
| WO | WO 03/028073 A1 | 4/2003 |

OTHER PUBLICATIONS

H.P. Povel et al., "Charge-coupled device image sensor as a demodulator in a 2-D polarimeter with a piezoelastic modulator," Applied Optics, Mar. 10, 1990, pp. 1186-1191, vol. 29, No. 8.

D. Wróblewski et al., "Polarimetry of motional Stark effect and determination of current profiles DIII-D (invited)," Rev. Sci. Instrum. Oct. 1992, vol. 63, No. 10.

M. Totzeck et al., "Edge localization of subwavelength structures by use of polarization interferometry and extreme-value criteria," Applied Optics, Dec. 1, 2000, vol. 39, No. 34.

M. Totzeck et al., "High-resolution inspection of 2D-microstructures using a multi-mode polarization microscopy," Proceedings of the 2nd Conference on Design and Fabrication, 2000, Japan.

D. Clarke and J. F. Grainger, "Polarized Light and Optical Measurement," Pergamon Press, Oxford, 1971.

"Optical Shop Testing", Edited by;Daniel Malacara, John Wiley & Sons, Inc., Second Edition, pp. 112-113, 1992, USA.

Michael I. Shribak et al, "Return-Path Polarimeter for two Dimensional Birefringence Distribution Measurement", Jul. 1999, SPIE, pp. 144-145 and 148-149, vol. 3654, Denver Colorado.

S. Berezhna. et al, "Accuracy of Whole-Field Mapping by Jones Matrix Fourier Photopolarimeter", 2000, Proceedings of the SPIE, pp. 81-89, vol. 4148.

Michael Totzeck, et al, "High-Resolution Measurement of 2D-Microstructures by Means of Jones-Matrix Microscopy", Institut Für Tecnische Optik, Universität Stuttgart, Germany, pp. 1-4, no date.

\* cited by examiner

METHOD AND APPARATUS FOR SPATIALLY RESOLVED POLARIMETRY

This application is a continuation-in-part of U.S. application Ser. No. 10/628,431, filed Jul. 29, 2003, which claims benefit of German Application No. 10304822.7, filed Jan. 31, 2003.

The invention relates to a method and an apparatus for the spatially resolved polarimetric examination of an imaging beam pencil generated by an associated radiation source.

Methods and apparatuses of this type are described, for determining the influence of an examined optical system on the state of polarization of optical radiation, in the earlier German patent application 103 04 822.7 and the parallel earlier U.S. application Ser. No. 10/628,431. The whole content of these two applications by the applicant is incorporated by reference herein. The methods and apparatuses described therein serve in particular for the spatially resolved and polarization-sensitive measurement of optical systems using an interferometric wavefront measurement technique, such as lateral shearing interferometry or point diffraction interferometry. Specifically, this permits a pupil-resolved, polarization-sensitive wavefront measurement of projection objectives for microlithography, if desired with determination of the so-called phase-reduced or complete Jones matrix or the so-called Stokes vector. In this case, use is made of a polarization analyzer arrangement that uses at least one rotatable polarization element, such as a λ/4 plate. In order to avoid such actively movable parts of the polarization analyzer arrangement, an analyzer variant is alternatively proposed wherein, as compensator, a plurality of individual compensator elements, such as individual λ/4 plates, with polarization directions that are rotated in a predetermined relationship with respect to one another are arranged such that they are situated fixedly next to one another.

The prior art discloses so-called photoelastic modulators (PEM), which are optical components which act like compensators with temporally varying retardation, i.e. delay phase. From a physical standpoint, they are elements made of materials which exhibit a stress birefringence effect dependent on the intensity of the pressure exerted e.g. as a result of acoustic oscillations. The frequency of the modulation or temporally varying retardation of such a PEM is typically a few tens of kHz, depending on its mechanical dimensioning. Reference shall be made in this respect, in representative fashion, to the journal papers H. P. Povel et al., "Two-dimensional polarimeter with a charge-coupled-device image sensor and a piezoelastic modulator", Appl. Opt. 33 (1994), page 4254, Povel et al., "Charge-coupled-device image sensor as a demodulator in a 2-D polarimeter with a piezoelastic modulator", Appl. Opt. 29 (1990), page 1186 and D. Wroblewski and L. L. Lao, "Polarimetry of motional Stark effect and determination of current profiles in DIII-D (invited)", Rev. Sci. Instr. 63 (1992), page 5140.

Such photoelastic modulators are produced and sold e.g. for wavelengths from the visible region through to the VUV region at approximately 130 nm by the company Hinds Instruments Inc., Hillsboro, Oreg., USA. Further details also with regard to the use of PEMs for polarization-sensitive measurement techniques on a sample beam, including the determination of a complete Stokes vector, are specified in the patent specifications and published patent applications U.S. Pat. No. 6,473,179 B1, U.S. Pat. No. 6,473,181 B1, U.S. Pat. No. 5,886,810 A1, U.S. Pat. No. 5,744,721 A1, U.S. Pat. No. 5,652,673 A1 and U.S. Pat. No. 6,268,914 B1. The measurement techniques disclosed therein are not concerned with the polarimetric examination of an imaging beam pencil, i.e. the simultaneous polarimetric examination of a pencil of rays, but rather of a respective sample beam. With the use of a resolved detector for image detection with exposure and read-out times of typically approximately 100 ms, such as e.g. of a CCD camera, in the case of the systems described therein, the PEM modulation would be averaged over the measurement and read-out time, i.e. the modulation-sensitive evaluation method described cannot be employed.

It is known, moreover, that it is possible to use the measurement of the Stokes vectors in the case of different states of polarization of the illumination of an objective for determining an image-field-resolved Müller matrix, from which an image-field-resolved Jones matrix can be determined, so that, in principle, a two-dimensional characterization of structures having dimensions in the subwavelength range is also possible in this way, see the journal papers M. Totzeck et al., "Edge localization of subwavelength structures by use of polarization interferometry and extreme-value criteria", Applied Optics, volume 39 (2000), No. 34, page 6295, and M. Totzeck et al., "High-resolution measurement of 2D-microstructures by means of Jones-matrix microscopy", Proceedings of the 2nd Conference on Design and Fabrication, Japan 2000. With regard to the relationships of Stokes vector and Müller matrix calculus, insofar as they are of interest here, mention shall be made of D. Clark and J. F. Grainger, "Polarized Light and Optical Measurement", Pergamon Press, Oxford, 1971.

The technical problem on which the invention is based is the provision of a method and an apparatus by means of which an imaging beam pencil can be examined polarimetrically with high temporal and spatial resolution and relatively short measurement times. This may involve, in particular, an imaging beam pencil which passes through a projection objective of a microlithography projection exposure apparatus and, in the process, serves for the highly accurate optical measurement of the objective e.g. by means of an interferometric wavefront measurement technique.

The invention solves this problem in a first aspect by providing a method for the spatially resolved polarimetric examination of an imaging beam pencil generated by an associated radiation source, having the following steps: introduction of a first photoelastic modulator, a second photoelastic modulator and a polarization element serially into the beam pencil, activation of a first modulation oscillation of the first photoelastic modulator and a second modulation oscillation of the second photoelastic modulator, use of a pulsed radiation source for generation of the beam pencil and driving of the radiation source for outputting a respective radiation pulse in a manner dependent on the oscillation state of the first photoelastic modulator and/or the second photoelastic modulator, and spatially resolved detection of the beam pencil coming from the polarization element.

In a further aspect of the invention, an apparatus suitable for carrying out this method comprises a pulsed radiation source for generating the beam pencil, a first and second photoelastic modulator and a polarization element for serial introduction into the beam pencil, a control unit for the driving of the photoelastic modulators and for the driving of the radiation source in a manner correlated therewith, and also a detector for the spatially resolved detection of the beam pencil coming from the polarization element.

The method and the apparatus of the invention enable a spatially resolved polarimetric examination of an imaging beam pencil with high temporal resolution or selectivity and short measurement times by virtue of the fact that, through corresponding triggering of the pulsed radiation source depending on the modulator oscillation state, the radiation pulses can be coordinated temporally precisely with the phase angle of the retardation of the respective photoelastic modulator.

In an advantageous development of the invention, different modulation frequencies are set for the two modulators and a plurality of measurement operations are carried out for different phase angles of their modulation. A spatially resolved Stokes vector is then determined from the measurement results. In order to simplify the calculation of the Stokes vector, the different phase angles can be chosen skillfully, e.g. measurement instants at which both phases are equal to 0° or equal to 90° or, of the two phase angles, a respective one is 0° and the other is 90°.

In advantageous realizations, the difference in the modulation frequency of the two modulators may lie e.g. between 0.1 kHz and 10 kHz, in particular in the order of magnitude of 1 kHz.

In an advantageous application, the invention serves for examining an imaging beam pencil of a sample system, such as an optical imaging system. Specifically, this may involve a projection objective of a microlithography projection exposure apparatus which is measured by means of an interferometric wavefront measurement technique, the polarization influence being taken into account.

In the examination of the imaging beam pencil, it is advantageous for the two photoelastic modulators to be positioned at essentially the same distance from a convergence point of the beam pencil in an associated detection optical arrangement, since then all the rays of the beam pencil experience approximately the same retardation by the two photoelastic modulators.

Figure 2:
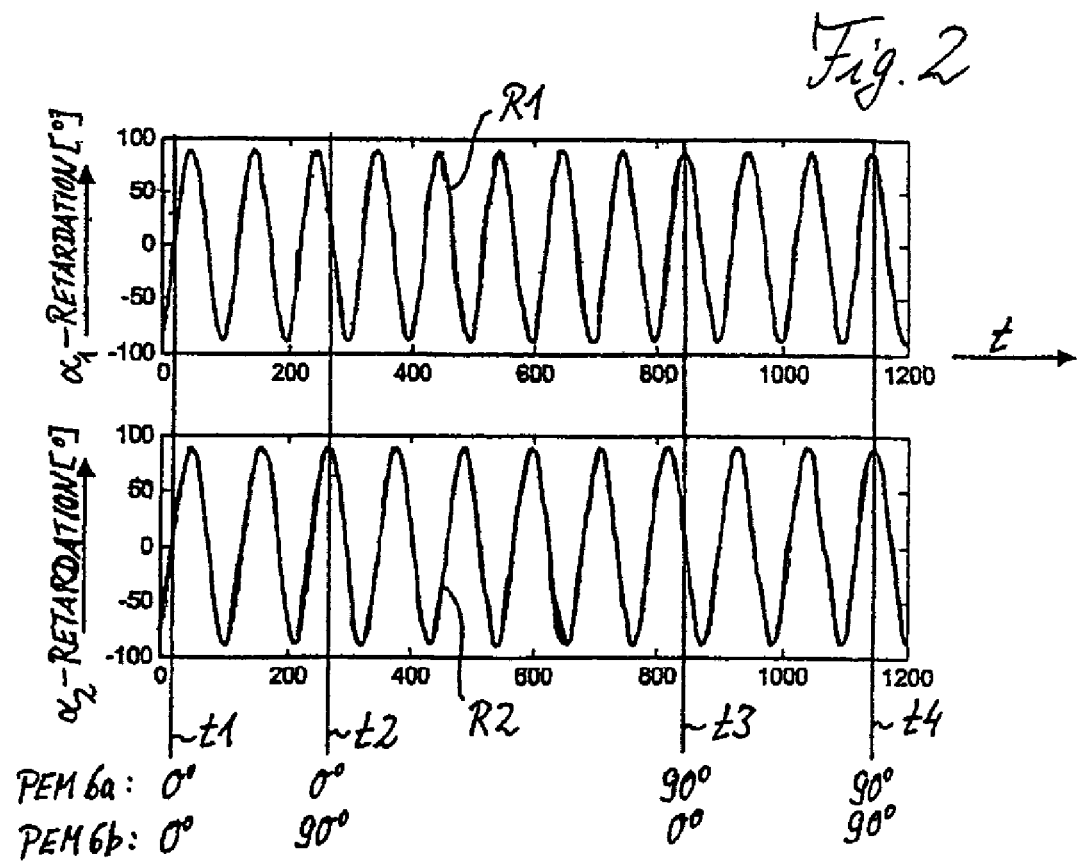

Advantageous embodiments of the inventions are illustrated in the drawings and are described below. In this case:

FIG. 1 shows a schematic side view of an apparatus for the spatially resolved polarimetric examination of an imaging beam pencil using two photoelastic modulators, and FIG. 2 shows a diagram of the temporal profile of the retardation for each of the two photoelastic modulators of FIG. 1 with depicted trigger instants for pulsed beam pencil generation.

The apparatus shown in FIG. 1 serves for the spatially resolved polarimetric examination of an imaging beam pencil 1, of which only two rays are reproduced in representative fashion in FIG. 1, for the sake of clarity, and which passes through a low-aperture imaging optical arrangement 2, of which only an entry-side lens 2a and an exit-side lens 2b are shown in representative fashion, for the sake of clarity. The imaging optical arrangement 2 functions as a detection optical arrangement and images an object or intermediate image plane 3 onto a detector area 4a of a spatially resolving detector 4, which may be e.g. a CCD camera, a diode linear array or a diode array. An evaluation unit 10 evaluates the detection information obtained by the detector 4. A polarization element 5, which may be realized e.g. by a polarization beam splitter, is introduced between the detection optical arrangement 2 and the detector 4. A numerical aperture of less than 0.1 is preferably chosen for the detection optical arrangement. The detection optical arrangement 2 may be realized e.g. as a 4f transfer optical arrangement.

A pair of photoelastic modulators 6a, 6b of conventional design is introduced into the detection optical arrangement 2, i.e. between the entry-side lens 2a thereof and the exit-side lens 2b thereof, preferably symmetrically with respect to an intermediate image plane 7 of the detection optical arrangement 2, at which the rays of the beam pencil 1 emerging from a point on the objective/intermediate image plane 3 intersect. In other words, a first photoelastic modulator (PEM) 6a is situated at a certain distance a in the beam path in front of said intermediate plane 7, while the other PEM 6b is situated at the same distance a in the beam path behind said intermediate plane 7. In the intermediate plane 7, as stated, the rays emerging from a point on the object/intermediate plane 3 meet again, so that, through the symmetrical position of the two PEMs 6a, 6b, all the rays of the beam pencil 1 to a good approximation experience the same retardation. As an alternative, however, other positionings of the two PEMs 6a, 6b are possible, depending on the required measurement accuracy and/or system calibration.

The two PEMs 6a, 6b are individually driven by a control unit 8, which additionally drives a radiation source 9, which is only indicated schematically in FIG. 1 and generates the beam pencil 1. The radiation source 9 is a radiation source 9 of pulsed operation, e.g. an excimer laser having pulse lengths of typically a few tens of nanoseconds. Such excimer lasers are for example also used as a light source in UV lithography. As an alternative, other radiation sources that can be operated in pulsed fashion can also be used, such as solid-state lasers with or without frequency multiplication.

Such pulse durations of typically only a few tens of nanoseconds are short enough to realize a sufficiently good phase resolution at the typical modulation frequencies of the PEMs 6a, 6b. Thus, e.g. given a pulse duration of 20 ns and a modulation frequency of 50 kHz, the result is a phase indeterminacy of a thousandth of a period or 0.36°. This is comparable with the positioning accuracy of a rotatable λ/4 plate that can customarily be achieved.

The control unit 8 triggers the pulsed radiation source 9 depending on the driving of the PEMs 6a, 6b, i.e. it activates the pulsed radiation source 9 for emitting a respective radiation pulse at defined instants which are chosen depending on the instantaneous oscillation state of the PEMs 6a, 6b, specifically on the phase angles of their modulation or retardation oscillation. The control unit 8 operates with a sufficient bandwidth of e.g. about 50 MHz, so that it does not cause any additional phase indeterminacy on account of imprecise triggering during the initiation of the correlated radiated pulses.

In a concrete application, the arrangement of FIG. 1 serves e.g. for the PEM-based, image-resolved Stokes polarimetry on a sample system 11, which may be in particular an optical imaging system, for example a microlithography projection objective, by which, depending on the application, e.g. an object plane or image plane or a pupil is imaged onto the detector area 4a. For this purpose, as shown schematically in FIG. 1, the sample system 11 is introduced at a suitable location into the beam path of the beam pencil 1 between the pulsed radiation source 9 and the detection optical arrangement 2.

In a manner that is not shown in specific detail, the three polarizing components 5, 6a, 6b are introduced into the beam path of the beam pencil 1 in predetermined orientations relative to one another, e.g. the first PEM 6a at an angle of 45°, the second PEM 6b at an angle of 0° and the polarization element 5 at an angle of 22.5°.

Hereinafter, with additional reference to FIG. 2, the concrete determination of the complete Stokes vector using the arrangement of FIG. 1 is explained in more detail on the basis of a specific example, which is not to be understood as a restriction and wherein the abovementioned orientations of 22.5°, 45° and 0° are respectively used for the three polarizing components 5, 6a and 6b. The Stokes vector of a light beam radiated in on a principal beam axis of the construction of FIG. 1 shall be designated as a vector (I, M, C, S). Furthermore, the time-dependent retardation of the first PEM 6a activated by the control unit 8 shall be designated by $\alpha_1$ and that of the second PEM 6b activated by the control unit 8 shall be designated by $\alpha_2$. With these designations, an intensity INT is determined for this light beam on the detector area 4a by means of a simple Müller matrix calculation in accordance with the following intensity relationship:

$$INT=[2I+(M-C)\cos(\alpha_2)+S \cdot 2^{0.5}\sin(\alpha_1)+(M+C)\sin(\alpha_1)\sin(\alpha_2)+(M+C+S \cdot 2^{0.5}\sin(\alpha_2))\cos(\alpha_2)]/4.$$

The control unit 8 then excites the two PEMs 6a, 6b to effect oscillations with somewhat different oscillation frequencies, so that the phase difference thereof correspondingly changes temporally and desired phase angles result for the retardation of the two PEMs 6a, 6b at trigger instants at which the pulsed radiation source 9 is triggered by the control unit 8 for generation of a respective radiation pulse.

In this respect, FIG. 2 shows an example of the temporal profile of the retardation of the first PEM 6a as a characteristic curve R1 in the upper partial diagram and the retardation of the second PEM 6b as a characteristic curve R2 in the second partial diagram situated temporally synchronously below the first partial diagram. In this case, the oscillation frequency of the modulation or retardation of the first PEM 6a is chosen to be somewhat greater than that of the second PEM 6b, as can be discerned from the two characteristic curves R1 and R2. At a first trigger instant t1, the retardation phase $\alpha_1$ of the first PEM 6a and the retardation phase $\alpha_2$ of the second PEM 6b are 0° in each case, i.e. $\alpha_1(t1)=\alpha_2(t1)=0$. At a later second trigger instant t2, the retardation values result as $\alpha_1(t2)=0°$ and $\alpha_2(t2)=90°$. At a later third trigger instant t3, their values are $\alpha_1(t3)=90°$ and $\alpha_2(t3)=0°$. At a later fourth trigger instant t4, both retardation phases have values of $\alpha_1(t4)=\alpha_2(t4)=90°$.

At each trigger instant t1, t2, t3, t4, the control unit 8 activates the pulsed radiation source 9 for emission of an individual radiation pulse. If such an individual radiation pulse does not suffice for the detection sensitivity of the detector 4 and the latter has an integral response action, as is the case e.g. for a CCD arrangement, for each of the four trigger instants t1 to t4 shown in FIG. 2, the triggering of a further radiation pulse is repeated as often as desired at the corresponding, periodically recurring retardation phase angle of the two PEMs 6a, 6b.

Inserting the phase angles $\alpha_1$, $\alpha_2$ for the four trigger instants t1 to t4 of FIG. 2 into the above intensity relationship INT($\alpha_1$, $\alpha_2$) produces the following intensity values for the four measurement operations at said trigger instants t1 to t4 or the repeated trigger operations with the same value of the retardation phase pair ($\alpha_1$, $\alpha_2$):

$$INT(t1) = (I+M)/2$$

$$INT(t2) = (2I+M+C-2^{0.5}S)/4$$

$$INT(t3) = (2I+M-C+2^{0.5}S)/4$$

$$INT(t4) = (2I+M+C+2^{0.5}S)/4$$

Combining these four intensity equations in matrix notation INT=TM·SV, where the intensity vector INT=(INT(t1), INT(t2), INT(t3), INT(t4))$^T$ and the Stokes vector SV=(I, M, C, S)$^T$, leads, after inversion of the matrix TM, to the equation SV=TM$^{-1}$·INT, where $$TM^{-1} = \begin{bmatrix} -2 & 2 & 2 & 0 \\ 4 & -2 & -2 & 0 \\ 0 & 0 & -2 & 2 \\ 0 & -\sqrt{2} & 0 & \sqrt{2} \end{bmatrix}.$$

Consequently, the complete Stokes vector SV and thus the state of polarization of the light beam that is radiated in can be determined by means of the four intensity measurements. It goes without saying that the numerical example chosen for the description above is not to be understood as a restriction and leads merely to relatively simple values of the matrix TM. It is possible, of course, to use alternative measurement operations at other trigger instants if the associated retardation phase pairs ($\alpha_1$, $\alpha_2$) thereof lead to at least four linearly independent equations of the detected intensity INT as a function of the Stokes vector elements I, M, C, S.

In practice, values of the order of magnitude of 1 kHz, for example, are favorable for the difference between the modulation frequencies of the two PEMs 6a, 6b, since the repeated triggering of the pulsed radiation source 9 in the case of the desired retardation phase angle can then be adapted very well to the repetition rate of a typical excimer laser of the order of magnitude of 1 kHz to 4 kHz.

In addition to a determination of the complete Stokes vector, it is also possible as required, by means of correspondingly different trigger sequences, to determine a subset of Stokes vectors with limited properties, e.g. only linearly or only circularly polarized states, in that the control unit 8 suitably selects the correlation between the activation of the PEMs 6a, 6b and the pulsed radiation source 9.

It goes without saying that the described evaluation of the detector information, in particular of the spatially resolved intensity values, is effected by the evaluation unit 10, which is designed suitably for this purpose.

With the use of a spatially resolving detector which operates in real time with a high bandwidth, such as diode linear arrays and diode arrays, it is not absolutely necessary for the purpose of determining the Stokes parameters, to use the particular properties of the radiation pulses triggered in a correlated manner, rather the conventional evaluation method by means of frequency analysis for the individual pixel signals of the detector also suffices, if appropriate, in this case.

The measurement of the Stokes vectors in the case of different states of polarization of the illumination of an object may additionally be used for the determination of an image-field-resolved Müller matrix, from which an image-field-resolved Jones matrix can in turn be determined. In this way, the method according to the invention is also suitable for a two-dimensional characterization of structures having dimensions in the subwavelength range. By using pulsed UV light sources, this characterization can be carried out for nanostructures having structure element widths of less than 100 nm. This may be beneficially used e.g. in CD metrology and defect inspection of semiconductor wafers and photomasks.

The apparatus and the method of the invention, as have been explained above for exemplary realizations with reference to FIGS. 1 and 2, are also suitable, in particular, for the spatially resolved or pupil-resolved determination of the influencing of the state of polarization by an examined optical imaging system, such as a microlithography projection objective, which can be measured in a polarization-sensitive manner in this case, in combination with an interferometric wavefront measurement technique, with regard to its aberration behavior. For this purpose, a corresponding measurement apparatus, as are described in the prior applications by the applicant mentioned in the introduction, is modified to the effect that, in particular in a detection part of the measurement apparatus, the two PEMs, as proposed in the present case, are used as polarization rotation elements with a variable polarization angle, in particular instead of rotationally movable polarization elements, such as λ/4 plates, and that a pulsed radiation source which is triggered in a correlated manner is used.

Thus, e.g. the apparatus which is shown in FIG. 1 of the earlier applications specified in the introduction and serves for the determination of the influencing of the state of polarization by a microlithography projection objective by means of ellipsometric measurement can be modified to the effect that at the detector, instead of the rotatable compensator therein which is connected downstream of a low-aperture detection optical arrangement, use is made of the two PEMs 6a, 6b in the present arrangement according to the invention, e.g. in accordance with the present FIG. 1, and the radiation source used is a pulsed radiation source, such as the pulsed radiation source 9 of the present FIG. 1, and, in addition, the control unit 8 in accordance with the present FIG. 1 is provided for the coupled driving of the two PEMs 6a, 6b and of the pulsed radiation source 9. As a result, the phase-reduced Jones matrix can then be determined in a spatially resolved manner or pupil-resolved manner, as described in detail in the prior applications, in the present case without rotationally movable polarization elements in the detection part.

A corresponding use of the two PEMs 6a, 6b instead of a rotationally movable polarizer or compensator in combination with the use of a pulsed radiation source and the control unit for the coupled driving of the pulsed radiation source and the two PEMs 6a, 6b is e.g. also possible in the apparatuses in accordance with FIGS. 2 and 4 of the two prior applications, so that the correspondingly modified apparatuses manage with fewer or without rotationally movable polarization elements. In this case, the modified apparatus derived from FIG. 2 of the prior applications then enables a determination of the complete Jones matrix e.g. for a microlithography projection objective as a sample system to be measured if the phase-reduced Jones matrix is already known, e.g. from a measurement by means of the apparatus of FIG. 1 of the prior applications or by means of the correspondingly modified apparatus according to the invention, as explained above. The apparatus provided by the abovementioned modification of the apparatus of FIG. 4 of the prior applications enables the determination of the phase-reduced Jones matrix, the invention making use of the PEM pair 6a, 6b instead of the rotatable polarizer at the detector. It goes without saying that, as required, the use according to the invention of a PEM pair in conjunction with a pulsed radiation source and a correlated driving of the pulsed radiation source and the PEM pair is also possible in other exemplary embodiments of the two prior applications and in arbitrary other conventional apparatuses for the spatially resolved Stokes polarimetry of a beam pencil.

The omission of mechanically rotatable polarization elements that are to be positioned enables a comparatively short measurement time for the method according to the invention and the apparatus according to the invention, especially as the problem of wear and hence the risk of failure of such mechanical rotatable polarizers or compensators are obviated. Whereas only relatively low angular velocities of the order of magnitude of 1 rpm are possible on account of the positioning tolerances in the case of mechanical rotatable polarization elements, and lead to a measurement duration of approximately 30 s for a complete measurement of the state of polarization of an imaging beam pencil, significantly shorter measurement times can be achieved by means of the invention. Therefore, the invention also makes it possible to detect faster changes of the state of polarization without impairment by an averaging effect.

The invention claimed is:

1. A method for the spatially resolved polarimetric examination of an imaging beam pencil generated by a radiation source of pulsed operation, comprising:
   introducing a first photoelastic modulator, a second photoelastic modulator and a polarization element into a path of the beam pencil,
   activating a first modulation oscillation of the first photoelastic modulator and a second modulation oscillation of the second photoelastic modulator,
   generating the beam pencil and driving of the radiation source for outputting a respective radiation pulse in a manner dependent on the oscillation state of at least one of the first photoelastic modulator and the second photoelastic modulator, and
   detecting the beam pencil coming from the polarization element with a spatially resolving detector.

2. The method as claimed in claim 1, wherein the first and second modulation oscillations are activated with different oscillation frequencies, and further comprising performing a plurality of measurement operations for different phase angles of the two modulation oscillations of the photoelastic modulators and determining a spatially resolved Stokes vector from results of the measurement operations utilizing the spatially resolving detector.

3. The method as claimed in claim 2, wherein at least four of the measurement operations are carried out respectively for phase angle pairs $(\alpha_1, \alpha_2)$, $(\alpha_1, \alpha_2+90°)$, $(\alpha_1+90°, \alpha_2)$ and $(\alpha_1+90°, \alpha_2+90°)$ of the phase angles of the two modulation oscillations of the photoelastic modulators, where $\alpha_1$ and $\alpha_2$ designate predetermined phase angles.

4. The method as claimed in claim 3, wherein the phase angles $\alpha_1$ and $\alpha_2$ are both predetermined as 0°.

5. The method as claimed in claim 2, wherein the difference between the oscillation frequencies of the two photoelastic modulators is in the range of between 0.1 kHz and 10 kHz.

6. The method as claimed in claim 5, wherein the oscillation frequency difference is around 1 kHz.

7. The method as claimed in one of claims 1 to 6, further comprising introducing a sample system into the beam path of the beam pencil.

8. The method as claimed in claim 7, wherein the sample system is a projection objective of a microlithography projection exposure apparatus.

9. The method as claimed in claim 8, further comprising performing an interferometric wavefront measurement of the projection objective using the beam pencil.

10. The method as claimed in claim 7, wherein the two photoelastic modulators are positioned at essentially equal distances from a convergence point of the beam pencil.

11. An apparatus for the spatially resolved polarimetric examination of an imaging beam pencil, comprising:
    a pulsed radiation source generating the beam pencil, a first photoelastic modulator, a second photoelastic modulator and a polarization element, each positioned in a beam path of the beam pencil, a control unit controlling the photoelastic modulators and driving the pulsed radiation source in a manner correlated with the control of the photoelastic modulators, and a spatially resolving detector detecting the beam pencil coming from the polarization element.

12. The apparatus as claimed in claim 11, wherein an evaluation unit is provided, which determines a spatially resolved Stokes vector on the basis of the detection information from the detector.

13. The apparatus as claimed in claim 11, with a sample system inserted into the beam path of the beam pencil and configured for the spatially resolved polarimetric examination of the imaging beam pencil.

14. The apparatus as claimed in claim 13, wherein the sample system is an optical imaging system and the examination comprises a pupil-resolved interferometric wavefront measurement of the optical imaging system.

15. The apparatus as claimed in claim 14, wherein the sample system is a microlithography projection objective.

* * * * *